(12) United States Patent
Ho et al.

(10) Patent No.: US 6,378,759 B1
(45) Date of Patent: Apr. 30, 2002

(54) METHOD OF APPLICATION OF CONDUCTIVE CAP-LAYER IN FLIP-CHIP, COB, AND MICRO METAL BONDING

(75) Inventors: Kwok Keung Paul Ho; Simon Chooi; Yi Xu; Yakub Aliyu; Mei Sheng Zhou; John Leonard Sudijono; Subhash Gupta; Sudipto Ranendra Roy, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/618,261

(22) Filed: Jul. 18, 2000

(51) Int. Cl.[7] ................................................. B23K 31/02
(52) U.S. Cl. .................. 228/180.21; 228/180.5
(58) Field of Search .................. 228/179.1, 180.1, 228/180.21, 180.22, 180.5

(56) References Cited

U.S. PATENT DOCUMENTS

| | | | |
|---|---|---|---|
| 3,942,245 A | * 3/1976 | Jackson et al. | |
| 5,075,965 A | * 12/1991 | Carey et al. | |
| 5,219,117 A | * 6/1993 | Lin | |
| 5,288,006 A | * 2/1994 | Otsuka et al. | |
| 5,376,235 A | 12/1994 | Langley | 156/664 |
| 5,384,284 A | 1/1995 | Doan et al. | 437/190 |
| 5,436,412 A | * 7/1995 | Ahmad et al. | |
| 5,445,311 A | * 8/1995 | Trask et al. | |
| 5,462,892 A | 10/1995 | Gabriel | 437/189 |
| 5,466,635 A | * 11/1995 | Lynch et al. | |
| 5,597,469 A | * 1/1997 | Carey et al. | |
| 5,647,942 A | 7/1997 | Haji | 156/281 |
| 5,672,260 A | * 9/1997 | Carey et al. | |
| 5,698,465 A | * 12/1997 | Lynch et al. | |
| 5,762,259 A | * 6/1998 | Hubacher et al. | |
| 5,771,157 A | * 6/1998 | Zak | |
| 5,785,236 A | * 7/1998 | Cheung et al. | |
| 5,891,756 A | 4/1999 | Erickson | 438/108 |
| 5,985,765 A | 11/1999 | Hsiao et al. | 438/694 |
| 6,006,427 A | * 12/1999 | Zak | |
| 6,153,505 A | * 11/2000 | Bolde et al. | |
| 6,282,100 B1 | * 8/2001 | Degani et al. | |

FOREIGN PATENT DOCUMENTS

JP 405235087 A * 9/1993

OTHER PUBLICATIONS

US 2001/0010323 A1 Dautartas (Aug. 2, 2001).*

* cited by examiner

Primary Examiner—Tom Dunn
Assistant Examiner—Kiley Stoner
(74) Attorney, Agent, or Firm—George O. Saile; Rosemary L. S. Pike; Stephen G. Stanton

(57) ABSTRACT

A method of bonding a bonding element to a metal bonding pad comprises the following steps. A semiconductor structure having an exposed, recessed metal bonding pad within a layer opening is provided. The layer has an upper surface. A conductive cap having a predetermined thickness is formed over the metal bonding pad. A bonding element is bonded to the conductive cap to form an electrical connection with the metal bonding pad.

17 Claims, 3 Drawing Sheets

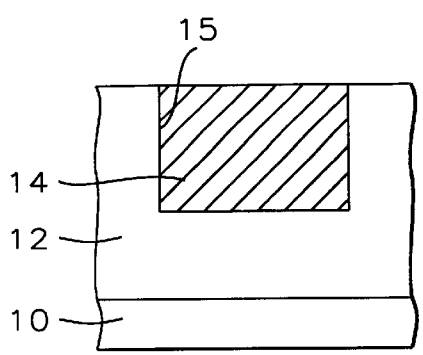
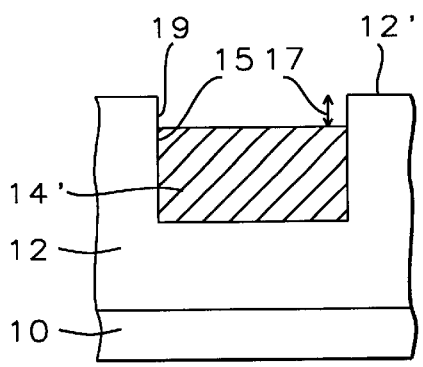
FIG. 1    FIG. 2
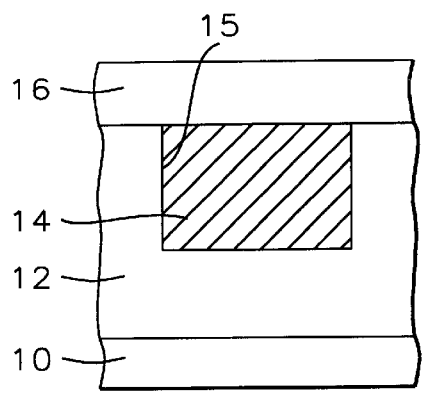
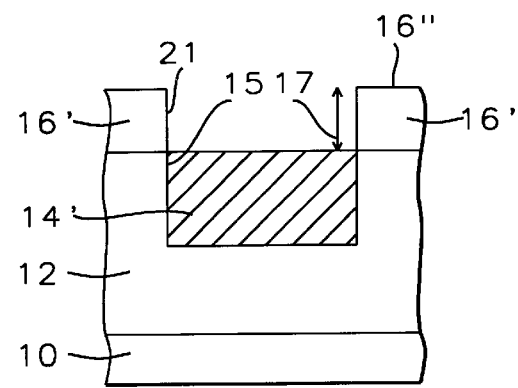
FIG. 3A    FIG. 3B
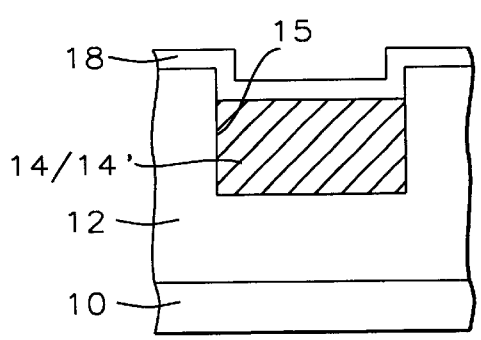
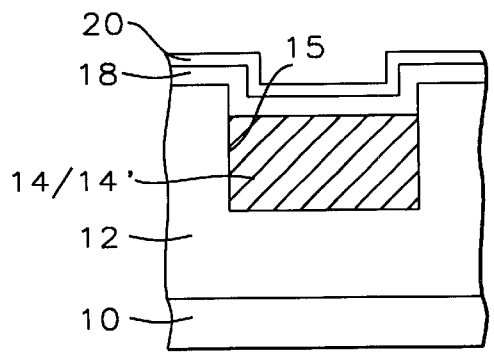
FIG. 4    FIG. 5A

METHOD OF APPLICATION OF CONDUCTIVE CAP-LAYER IN FLIP-CHIP, COB, AND MICRO METAL BONDING

BACKGROUND OF THE INVENTION

Copper (Cu) is gradually replacing aluminum (Al) as the interconnect material in integrated circuits. However, a problem arises due to the fact that the top layer Cu pad does not form a good connection with the normal bonding techniques. This is mainly due to the poor quality of copper oxide formed on the Cu pad surface upon exposure to the atmosphere and moisture.

In order to ensure a good contact between the chip and the bonding element, either the top Cu metal layer has to be replaced by Al, or an indirect way of bonding is needed. Both of these options increase the complexity and cost.

U.S. Pat. No. 5,384,284 to Doan et al. describes a process to form a pad interconnect whereby a metal layer or a metal alloy is bonded to an underlying aluminum pad by chemical vapor deposition (CVD) or by electroless deposition. A conductive epoxy film is then adhered to the metal layer. The metal layer may be comprised of, for example, Cu, Ni, W, Au, Ag, or Pt and the metal alloy may be comprised of titanium nitride, for example.

U.S. Pat. No. 5,462,892 to Gabriel describes a method of processing a semiconductor wafer so as to inhibit corrosion of aluminum or other metal interconnection lines. Such interconnection lines may be composed of tungsten (W)/titanium (Ti), aluminum (Al), aluminum-copper (Cu), or successive layers of W/Ti and Al—Cu. Once the interconnection lines are etched, the wafer is moved from an etching chamber a post-etching processing chamber, without exposure to the atmosphere, where a thin native oxide is formed on the exposed sidewalls of the just etched interconnection lines. The oxide layer protects the wafer surface from acidic corrosion upon subsequent exposure to the atmosphere.

U.S. Pat. No. 5,985,765 to Hsiao et al. describes a method for reducing bonding pad loss using a capping layer, preferably comprised of tungsten, when contact openings are etched to the bonding pads while much deeper fuse openings are concurrently etched.

U.S. Pat. No. 5,376,235 to Langley describes a process of using a wet chemical process to remove chlorine from dry etched metal features on a semiconductor wafer before an alloy step. The wet chemical process includes a 20:1 phosphoric acid solution dip that prevents the formation of voids in the etched metal features during subsequent alloying steps up to about 425° C. by removing chlorine.

U.S. Pat. No. 5,785,236 to Cheung et al. describes a process for forming electrical connection between metal wires and metal interconnections not otherwise bondable, i.e. gold and aluminum wires and copper interconnects. The copper pads are modified, by forming an aluminum pad thereover, to permit the use of conventional wire bonding techniques.

U.S. Pat. No. 5,891,756 to Erickson describes a method for forming a solder bump pad, and specifically to converting a wire bond pad of a surface-mount IC device to a flip-chip solder bump pad such that the IC device can be flip-chip mounted to a substrate. The method uses a Ni layer over the pad.

U.S. Pat. No. 5,647,942 to Haji describes a wire bonding method including the step of removing a thin surface layer of an electrode comprising a copper layer and a nickel layer formed on the surface of the copper layer and coated with gold on the surface. This removes nickel hydroxide and nickel oxide present on the gold film.

SUMMARY OF THE INVENTION

Accordingly, it is an object of the present invention to provide a method of bonding a metal wire to a copper bonding pad.

A further object of the present invention is to provide a method of preparing a copper bonding pad to permit the use of normal bonding techniques to bond a wire to the copper bonding pad.

Another object of the present invention is to provide a method of bonding a metal wire to a copper bonding pad with good adhesion.

Yet another object of the present invention is to provide a method of bonding a metal wire to a copper bonding pad with minimum process complexity.

Other objects will appear hereinafter.

It has now been discovered that the above and other objects of the present invention may be accomplished in the following manner. Specifically, a semiconductor structure having an exposed, recessed metal bonding pad within a layer opening is provided. The layer has an upper surface. A conductive cap having a predetermined thickness is formed over the metal bonding pad. A bonding element is bonded to the conductive cap to form an electrical connection with the metal bonding pad.

BRIEF DESCRIPTION OF THE DRAWINGS

The features and advantages of the method of bonding a wire to a metal bonding pad according to the present invention will be more clearly understood from the following description taken in conjunction with the accompanying drawings in which like reference numerals designate similar or corresponding elements, regions and portions and in which:

FIG. 1 schematically illustrates in cross-sectional representation the beginning structure for the embodiments of the present invention according to the present invention.

FIG. 2 schematically illustrates in cross-sectional representation a first embodiment of forming a recessed metal bonding pad structure according to the present invention.

FIGS. 3A and 3B schematically illustrate in cross-sectional representation a second embodiment of forming a recessed metal bonding pad structure according to the present invention.

FIG. 4 schematically illustrates in cross-sectional representation a conductive cap layer formed over the recessed metal bonding pad structure of either FIG. 2, or 3B according to the present invention.

FIGS. 5A–5C schematically illustrate in cross-sectional representation a first embodiment for patterning the conductive cap layer of FIG. 4 over the metal bonding pad according to the present invention.

DETAILED DESCRIPTION OF THE PREFERRED EMBODIMENT

Starting Copper Bonding Pad Structure

Figure 5B:
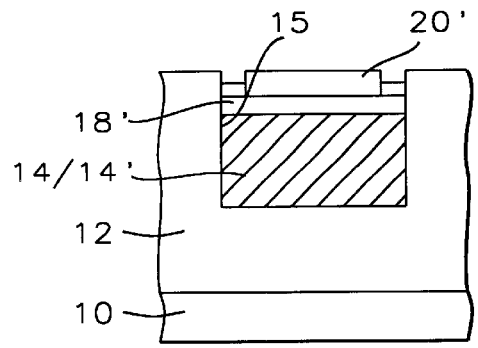

Accordingly FIG. 1 shows a schematic cross-sectional diagram of metal bonding pad 14 within opening 15 of intermetal dielectric (IMD) layer 12 of an integrated circuit that includes semiconductor structure 10.

Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

IMD layer 12 is formed over semiconductor structure 10. Bonding pad opening 15 is etched within IMD layer 12. Metal bonding pad 14 is formed within bonding pad opening 15

Unless otherwise specified, all structures, layers, etc. may be formed or accomplished by conventional methods known in the prior art.

Metal bonding pad 14 may be comprised of copper or a copper alloy such as AlCu, and is preferably copper, and contacts underlying circuitry (not shown) covered by IMD layer 12. For purposes of illustration, metal bonding pad 14 will be considered comprised of copper hereafter in all subsequent embodiments.

Methods of Recessing the Copper Bonding Pad

There are two different illustrated embodiments to effectively recess copper bonding pad 14 starting with the structure shown in FIG. 1. The first such embodiment is illustrated in FIG. 2 (wet stripping, or etching). The second such embodiment is illustrated in FIGS. 3A and 3B (normal passivation mask and etch). These two alternate methods of forming a copper recess will be discussed in turn.

I. As shown in FIG. 2 (the first copper recess embodiment example), the copper recess may be formed by wet stripping, or etching, copper bonding pad 14 of FIG. 1 using $HNO_3$, $O2/NH_3$, $O_2$/ammonium salt, $HF/CH_3COOH$, or other conventional chemistries at room temperature, but time of etching and concentration will affect the amount of copper etched which is determined by the depth of the recess needed.

This creates opening 19 within IMD layer 12 over recessed copper bonding pad 14'.

Recessed copper bonding pad 14' so formed is recessed from about 500 to 10,000 Å beneath the upper surface 12' of IMD layer 12, and more preferably from about 1000 to 5000 Å.

II. FIGS. 3A and 3B illustrate the second copper recess embodiment example. As shown in FIG. 3A, passivation layer 16 is formed over copper bonding pad 14 and IMD layer 12 of FIG. 1.

As shown in FIG. 3B, passivation layer 16 may be masked (not shown) and etched to form opening 21 exposing copper bonding pad 14 and leaving passivation layer portions 16' on either side of copper bonding pad 14.

For either the FIG. 2 embodiment or the FIGS. 3A and 3B embodiment of forming recessed copper bonding pad 14', 14, respectively, recessed copper bonding pad 14', 14 is recessed 17 from about 1000 to 10,000 Å, and more preferably from about 2000 to 7000 Å beneath the surface 12', 16" of patterned IMD layer 12 and patterned passivation layer 16', respectively.

Methods of Forming a Conductive Cap Layer Over the Recessed Copper Bonding Pad In a key step of the invention, and in whichever embodiment is used to form recessed copper bonding pad 14', 14, conductive cap layer, preferably comprised of titanium (Ti), tantalum (Ta), tungsten (W), or other metal or conductive compound which has a good adhesion between the Cu bonding pad 14', 14 and the bonding element 22, in all embodiments of the present invention, is then formed over recessed copper bonding pad 14' 14 as shown in FIGS. 4, 5A–5C, 6A–6C, and 7. For purposes of simplicity, patterned passivation layer 16' will not be shown.

As shown in FIG. 4, conductive cap layer 18 is formed over recessed copper bonding pad 14', 14 and either patterned IMD layer 12 or patterned passivation layer 16' (not shown). Conductive cap 18 may be formed by a PVD or CVD method. Conductive cap layer 18 is from about 500 to 5000 Å thick, and more preferably from about 1000 to 4000 Å.

Figure 5C:
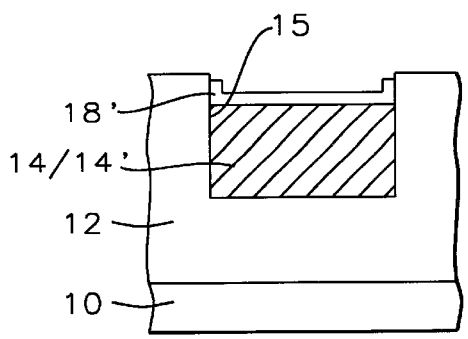
Figure 6A:
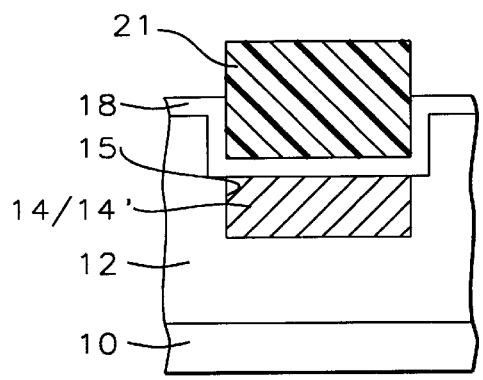
FIGS. 6A–6C schematically illustrate in cross-sectional representation a second embodiment for patterning the conductive cap layer of FIG. 4 only over the metal bonding pad according to the present invention.
Figure 6B:
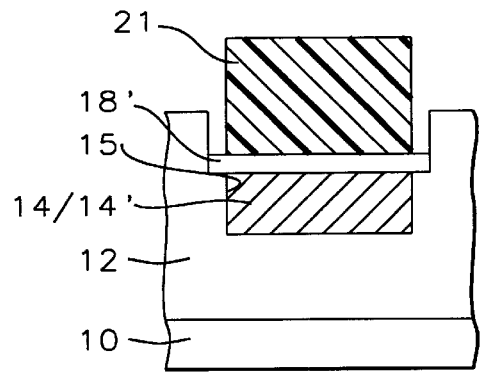
Figure 6C:
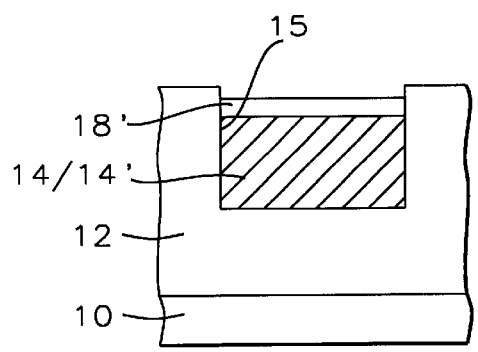
Figure 7:
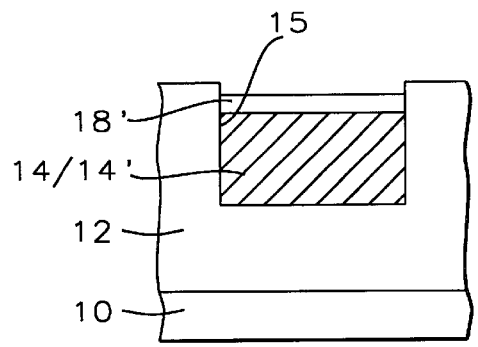
FIG. 7 schematically illustrates in cross-sectional representation a third embodiment for defining the conductive cap layer of FIG. 4 only over the metal bonding pad according to the present invention.

There are three different illustrated embodiments to pattern conductive cap layer 18 so as to only cover recessed copper bonding pad 14', 14. The first such embodiment is illustrated in FIGS. 5A–5C (spin-on-material deposition and blanket etch back). The second such embodiment is illustrated in FIGS. 6A–6C (photoresist masking and etching). The third such embodiment is illustrated in FIG. 7 (chemical mechanical polishing).

I. FIGS. 5A–5C illustrate the first conductive cap layer 18' formation embodiment example (spin-on-material deposition and blanket etch back). As shown in FIG. 5A, spin-on-coating 20 is deposited over conductive cap layer 18 of FIG. 4 preferably by a spin-on technique.

Spin-on-coating 20 may be comprised of photoresist, polyimide, organic planarization BARC, or spin-on-glass (SOG) and is preferably comprised of photoresist. Spin-on-coating 20 is generally thicker over opening 15 and thinner over the surface 12' of patterned IMD layer 12 due to planarization effect.

As shown in FIG. 5B, a blanket etch is then performed, removing that portion of spin-on-coating 20 and conductive cap layer 18 over the surface 12' of patterned IMD layer 12, leaving some of spin-on-coating 20 and all of conductive cap layer 18' within opening 15 over recessed copper bonding pad 14', 14.

As shown in FIG. 5C, an ashing, a wet ashing, or the combination of the two, and a cleaning step removes the remaining portion of spin-on-coating 20 within opening 15, leaving conductive cap layer 18' over recessed copper bonding pad 14', 14.

II. FIGS. 6A–6C illustrate the second conductive cap layer 18' formation embodiment example (photoresist masking and etching). As shown in FIG. 6A, photoresist mask layer 21 is selectively formed over the portion of conductive cap layer 18 within opening 15 of FIG. 4, by a reverse mask process or a reverse-tone resist process to mask that portion of conductive cap layer 18 within opening 15.

As shown if FIG. 6B, the unmasked portion of conductive cap layer 18 is etched, preferably by a plasma etch, and removed.

As shown in FIG. 6C, photoresist mask 21 is removed, preferably by ashing, and the structure is cleaned.

III. FIG. 7 illustrates the third conductive cap layer 18' formation embodiment example (chemical mechanical polishing). As shown in FIG. 7, the conductive cap layer 18 of FIG. 4 is polished to remove the excess of conductive cap layer 18 over patterned IMD layer 12 or passivation layer 16' (not shown), preferably by chemical mechanically polishing (CMP).

Regardless of which of the three conductive cap layer 18' formation embodiment examples are employed the resulting structures shown in FIGS. 5C, 6C and 7 are essentially identical.

Figure 8:
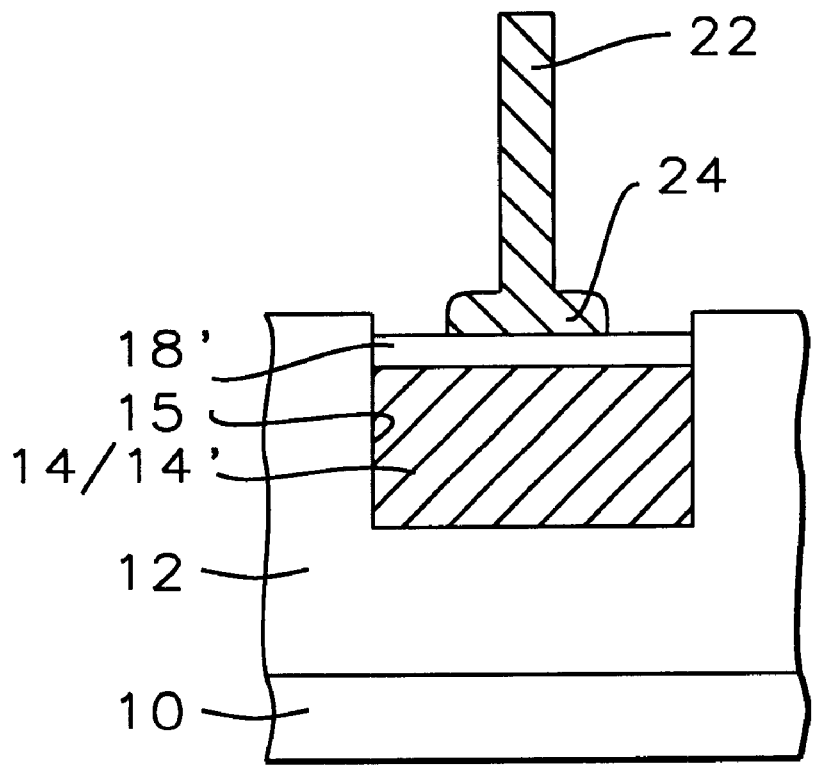
FIG. 8 schematically illustrates in cross-sectional representation the preferred embodiment for bonding a bonding element to the defined conductive cap layer structure of either FIGS. 5C, 6C, or 7C according to the present invention.

As shown in FIG. 8, bonding element 22 is positioned to contact, or connect, to conductive cap layer 18' at 24 of any of the structures illustrated in FIGS. 5C, 6C, or 7. Conductive cap layer 18' effectively acts as a good glue layer to permit bonding or attachment of bonding element 22, allowing an electrical connection between bonding element 22 and recessed copper bonding pad 14', 14.

Bonding element 22 may be comprised of gold or aluminum, and is preferably gold, and may be a wire. For purposes of illustration, bonding element 22 will be considered to be a gold wire hereafter.

Gold wire (bonding element) 22 is placed vertically (at an angle of about 90°) above conductive cap layer 18'.

Thus, by implementing the present invention, there is a minimum compromise in the resistivity of the top layer, i.e. conductive cap layer 18', as Cu instead of Al can be used as the bonding pad, i.e. recessed copper bonding pad 14', 14. In addition, conductive cap layer 18' is a good glue layer between recessed copper bonding pad 14', 14 and gold bonding element 22.

While particular embodiments of the present invention have been illustrated and described, it is not intended to limit the invention, except as defined by the following claims.

We claim:

1. A method of bonding a bonding element to a metal bonding pad, comprising the steps of:

providing a semiconductor structure having an exposed, recessed metal bonding pad within a layer opening; said layer opening having an upper surface;

forming a conductive cap having a predetermined thickness only over said metal bonding pad; and bonding a bonding element to said conductive cap to form an electrical connection with said metal bonding pad.

2. The method of claim 1, wherein said metal bonding pad is comprised of a material selected from the group comprising copper and a copper alloy; and said bonding element is comprised of a material selected from the group comprising aluminum and gold.

3. The method of claim 1, wherein said metal bonding pad is comprised of copper, and said bonding element is comprised of gold.

4. The method of claim 1, wherein said bonding element is a wire.

5. The method of claim 1, wherein said conductive cap is from about 500 to 5000 Å thick.

6. The method of claim 1, wherein said conductive cap is from about 1000 to 4000 Å thick.

7. The method of claim 1, wherein said bonding element is positioned at an angle of about 90° relative to said bonding pad.

8. The method of claim 1, wherein said metal bonding pad is recessed from about 500 to 5000 Å below said top surface of said layer.

9. The method of claim 1, wherein said metal bonding pad is recessed from about 1000 to 5000 Å below said top surface of said layer.

10. A method of bonding a bonding element to a metal bonding pad, comprising the steps of:

providing a semiconductor structure having an exposed, recessed metal bonding pad within a layer opening; said layer opening having an upper surface; said metal bonding pad is comprised of a material selected from the group comprising copper and a copper alloy;

forming a conductive cap having a predetermined thickness only over said metal bonding pad; and bonding a bonding element to said conductive cap to form an electrical connection with said metal bonding pad; said bonding element is comprised of a material selected from the group comprising aluminum and gold.

11. The method of claim 10, wherein said metal bonding pad is comprised of copper, and said bonding element is comprised of gold.

12. The method of claim 10, wherein said bonding element is a wire.

13. The method of claim 10, wherein said conductive cap is from about 500 to 5000 Å thick.

14. The method of claim 10, wherein said conductive cap is from about 1000 to 4000 Å thick.

15. The method of claim 10, wherein said bonding element is positioned at an angle of about 90° relative to said bonding pad.

16. The method of claim 10, wherein said metal bonding pad is recessed from about 500 to 5000 Å below said top surface of said layer.

17. The method of claim 10, wherein said metal bonding pad is recessed from about 1000 to 5000 Å below said top surface of said layer.

* * * * *